(12) United States Patent
Cadwell et al.

(10) Patent No.: US 7,736,436 B2
(45) Date of Patent: Jun. 15, 2010

(54) DETACHABLE EDGE RING FOR THERMAL PROCESSING SUPPORT TOWERS

(75) Inventors: Tom L. Cadwell, Los Altos, CA (US); Ranaan Zehavi, Sunnyvale, CA (US); Michael Sklyar, San Jose, CA (US)

(73) Assignee: Integrated Materials, Incorporated, Sunnyvale, CA (US)

(*) Notice: Subject to any disclaimer, the term of this patent is extended or adjusted under 35 U.S.C. 154(b) by 949 days.

(21) Appl. No.: 11/329,971

(22) Filed: Jan. 11, 2006

(65) Prior Publication Data

US 2007/0006803 A1 Jan. 11, 2007

Related U.S. Application Data

(60) Provisional application No. 60/697,895, filed on Jul. 8, 2005, provisional application No. 60/721,926, filed on Sep. 29, 2005.

(51) Int. Cl.
*C30B 35/00* (2006.01)

(52) U.S. Cl. ............... 117/200; 432/253; 432/258; 414/935; 414/937; 414/938

(58) Field of Classification Search ............... 117/200; 432/253, 258; 414/935, 937, 938
See application file for complete search history.

(56) References Cited

U.S. PATENT DOCUMENTS

| | | | | |
|---|---|---|---|---|
| 5,162,047 | A | 11/1992 | Wada et al. | 29/25.01 |
| 5,192,371 | A | 3/1993 | Shuto et al. | 118/728 |
| 5,316,472 | A * | 5/1994 | Niino et al. | 432/241 |
| 5,334,257 | A | 8/1994 | Nishi et al. | 118/500 |
| 5,820,367 | A | 10/1998 | Osawa | 432/253 |
| 6,062,853 | A * | 5/2000 | Shimazu et al. | 432/258 |
| 6,156,121 | A | 12/2000 | Hasebe et al. | 118/500 |
| 6,538,277 | B2 | 3/2003 | Sung et al. | 257/317 |
| 2003/0213785 | A1 * | 11/2003 | Zehavi et al. | 219/121.63 |

* cited by examiner

*Primary Examiner*—Robert M Kunemund
*Assistant Examiner*—Matthew J Song
(74) *Attorney, Agent, or Firm*—Charles S. Guenzer (57) ABSTRACT

An edge ring for use in batch thermal processing of wafers supported on a vertical tower within a furnace. The edge rings are have a width approximately overlapping the periphery of the wafers and are detachably supported on the towers equally spaced between the wafer to reduce thermal edge effects. The edge rings have may have internal or external recesses to interlock with structures on or adjacent the fingers of the tower legs supporting the wafers or one or more steps formed on the lateral sides of the edge ring may slide over and then fall below a locking ledge associated with the support fingers. Preferably, the tower and edge ring and other parts of the furnace adjacent the hot zone are composed of silicon.

11 Claims, 10 Drawing Sheets

FIG. 16

DETACHABLE EDGE RING FOR THERMAL PROCESSING SUPPORT TOWERS

RELATED APPLICATIONS

This application claims benefit of provisional application 60/697,895, filed Jul. 8, 2005 and provisional application 60/721,926, filed Sep. 29, 2005.

FIELD OF THE INVENTION

The invention relates generally to batch thermal processing of substrates, especially silicon wafers. In particular, the invention relates to auxiliary rings used in wafer support towers.

BACKGROUND ART

Batch thermal processing, in which multiple wafers are simultaneously processed in a furnace, continues to be widely practiced in the semiconductor industry. Most modern batch thermal processing is based on vertical furnaces in which a vertically arranged support tower holds a large number of wafers in a horizontal orientation. The towers are conventionally composed of quartz, especially for processing temperatures under 1000° C. or of silicon carbide, especially for higher processing temperatures, but silicon towers are entering service in commercial use for all temperature ranges.

One process that utilizes such thermal processing is high temperature oxidation (HTO), in which very thin oxide layers are grown by chemical vapor deposition (CVD) using $SiH_4$ and $N_2O$ or NO as precursor gases. Typical CVD temperatures are in the neighborhood of 750° C. The thin oxide may have a thickness in the vicinity of 2.5 nm or less and be used for a tunneling barrier, for example, in flash memories. Other processes are available for growing thin films, such as using $O_2$ as an oxidizing agent.

Figure 1:
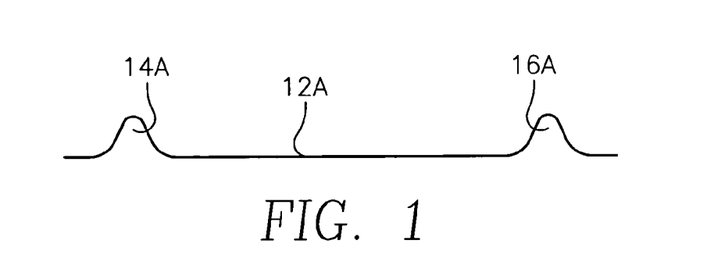
FIG. 1 is a thickness profile of oxide grown by a high temperature oxidation process.

Thickness uniformity of the grown film has, however, been a problem. A thickness profile 12A is schematically illustrated in the graph of FIG. 1. Two peaks 14A, 16A in the thickness have been observed near the wafer periphery. The peaks 14A, 16A may represent 16% and 33% variation on opposed sides, and, since tunnel current varies exponentially with thickness, a modest thickness variation can produce a large variation in tunneling current and hence the recording performance of flash memories.

The specific origin of the peaks is not completely understood, but possible causes are believed to include thermal edge effects such as thermal shadowing by the tower legs or proximity to the furnace wall, and by gas flow discontinuities at the wafer periphery. Some have attempted to solve this problem by attaching auxiliary rings to the tower which extend over the edge of the wafer a small distance toward the center. Optimally, the wafer is spaced between the two neighboring edge rings facing its upper and lower faces. Edge rings have been shown to be effective at reducing if not eliminating the peaks.

The typical design includes a quartz tower and quartz edge rings which are fused with the three or four legs of the tower. This design suffers several problems. Although the quartz is relatively inexpensive, the fusing at so many locations is laborious. If one of the edge rings is broken in service, repair is almost impossible. Either the tower and welded edge rings are discarded or the wafer locations around the broken edge ring are not thereafter used for production wafers. Although quartz is generally accepted for use in thermal support fixtures, advancing technology calls into question whether it has an adequate purity level.

Accordingly, a better design is desired for edge rings and their support towers.

SUMMARY OF THE INVENTION

A ring tower includes fingers or other projections to support in a vertical stack both wafers and generally annular edge rings which are interleaved between the wafers and preferably extend over a radial band extending outwardly from the periphery of the wafers.

Both the tower and the edge rings are preferably composed of silicon. The edge rings are more preferably formed of randomly oriented polycrystalline silicon (ROPSi), which may be grown by the Czocharalski method using a polycrystalline seed. The silicon seed may be composed of virgin polycrystalline silicon (electronic grade silicon) grown by CVD or of Czochralski-grown silicon grown from a seed traceable to a virgin polycrystalline silicon seed.

Advantageously, the rings are passively interlocked with the tower, for example, by gravitational force. The interlocking can be achieved with recesses formed on the inner or outer periphery of the ring or by steps on its lateral sides.

DETAILED DESCRIPTION OF THE PREFERRED EMBODIMENTS

Figure 2:
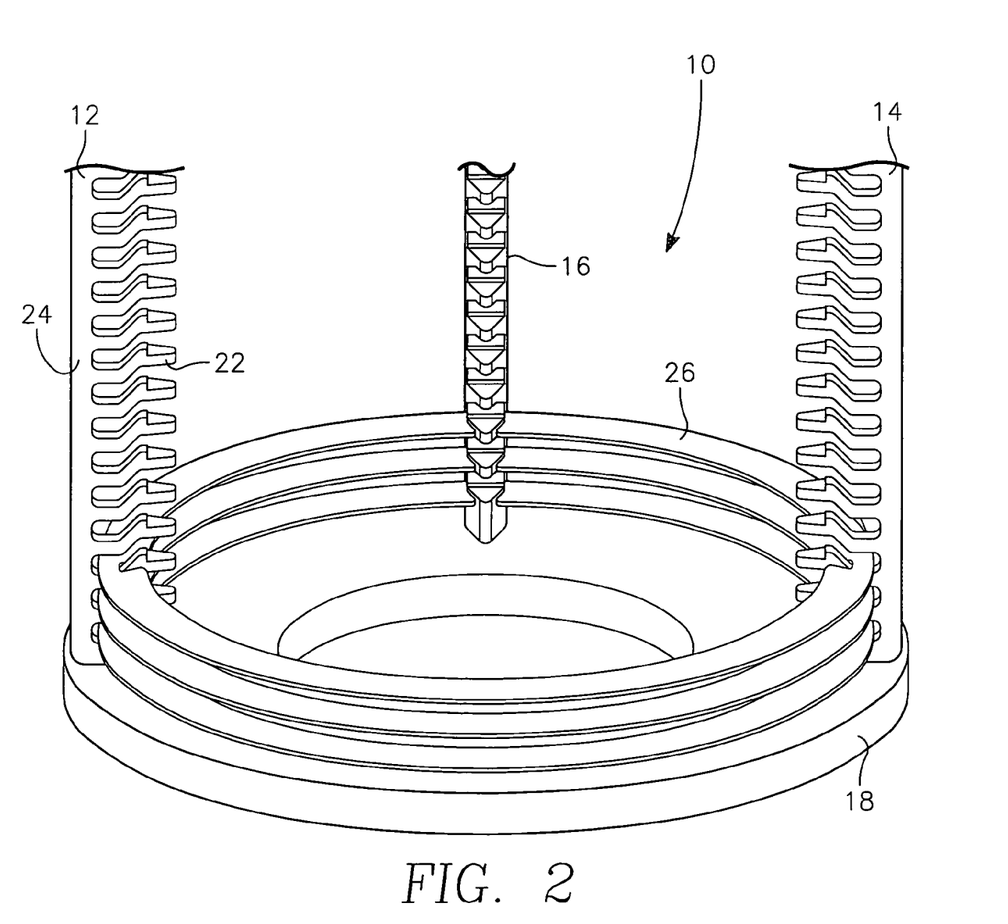
FIG. 2 is an orthographic view of an embodiment of the invention including a tower and edge rings.
Figure 3:
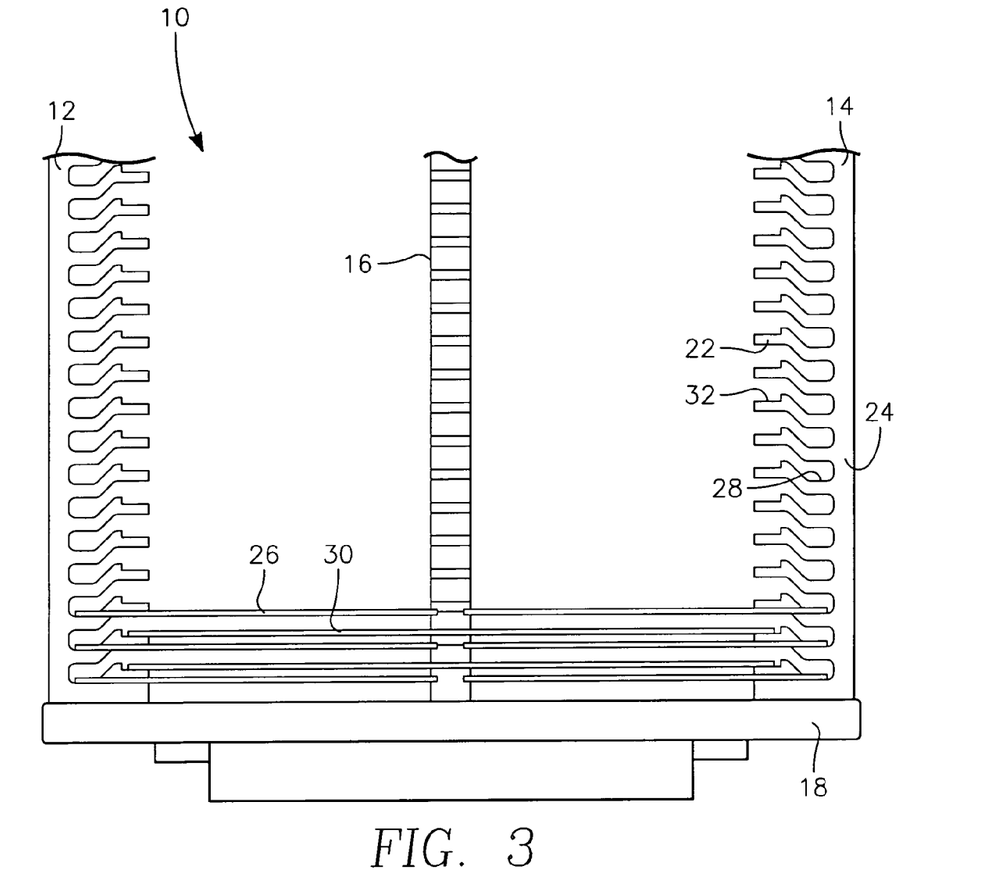
FIG. 3 is an elevational view of the tower and edge rings of FIG. 2 and also of the wafers.

A first embodiment of the invention, illustrated in the orthographic view of FIG. 2 and the elevational view of FIG. 3, includes a support tower 10 including two side legs 12, 14 and a back leg 16 fixed at their lower ends to a bottom base 18 and at their top ends to a similar unillustrated top base. The legs 12, 14, 16, also illustrated in the exploded orthographic view of FIG. 4, may be similarly configured and include fingers 22 projecting generally inwardly from axially extending leg stems 24. The fingers 22 at corresponding axial positions of the three legs 12, 14, 16 support edge rings 26 on radially outward and lower ring support surfaces 28. The fingers 22 also support wafers 30 on radially inward and upper wafer support surfaces 32, which are generally planar and horizontal and defined on their inner sides by ridges 34. The ridges 34 are positioned to be closely outside the circular wafers 30 supported on the wafer support surfaces 32, to thereby align the wafers 30 on the tower 10.

Figure 5:
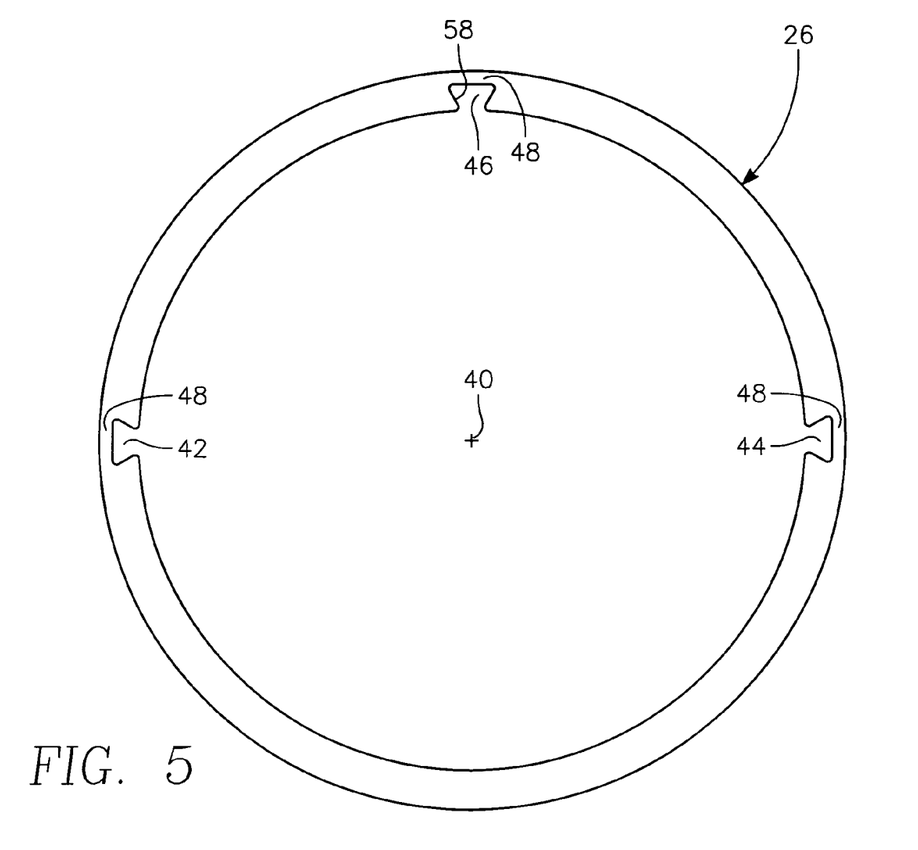
FIG. 5 is a plan view of an edge ring of the invention.

One edge ring 26, illustrated in the plan view of FIG. 5 is a generally annular washer-shaped body generally circularly symmetric about a center 40, which is intended to coincide with the center of the tower 10 and the centers of the wafers 30. However, the edge ring 26 is machined to include two side recesses 42, 44 and a back recess 46 of generally similar shapes to respectively engage the edge ring 26 on the two side legs 12, 14 and back leg 16. Thin segments 48 in back of the recesses 42, 44, 46 support the edge ring 26 on the legs 12, 14, 16 of the tower 10. The outside of the segments 48, particularly on the sides, may be flattened with the side flattening being parallel to the insertion direction to allow a larger outer diameter. The recesses 42, 44, 46 are disposed at positions extending circumferentially about the center 40 around the back of the ring 26 by an angle sufficiently larger than 180° such that the legs 12, 14, 16 at similar angular spacings stably support the edge rings 26 but sufficiently small that the side legs 12, 14 do not interfere with the insertion of the edge rings 26 (as well as the wafers 30) past the side legs 12, 14. For example, the centers of the side recesses 42, 44 are displaced a little forward of the ring center 40.

The inner diameter of the edge ring 26 may be approximately the diameter of the wafer or a little larger, for example, up to 4 to 10 mm larger, for example, 6 mm larger. It is possible to extend the edge ring 26 somewhat inside the wafer diameter, for example, by less than 10 mm for a 200 or 300 mm wafer. In general, the deviance from congruent diameters should not significantly exceed the pitch between wafers 30 in the tower so that a substantial fraction of the solid angle around the wafer edge views wafers 30 or edge rings 26 of the same temperature. Stated differently, the edge of the wafer 30 should not view the furnace walls or liner except through the gap between the two neighboring edge rings 26, which presents a relatively small viewing angle of the liner. Similarly, the annular width of the edge rings 26 should be greater than the pitch between wafers 30. The outer diameter of the edge ring 26 should be significantly greater than the wafer diameter to extend the uniform temperature outwardly. The additional diameter may correspond to the location of the peaks 14A, 16A in FIG. 1 from the wafer periphery absent edge rings. As a result, for the most part, the wafer 30 view only other wafers 30 or edge rings 26, all of which equilibrate to about the same temperature. The largest temperature excursions occur at the outer edges of the edge rings 26 rather than the outer edges of the wafers 30. The edge rings 26 should move the non-uniform deposition peaks 14A, 16A outside of the area of the wafers 30 and onto the edge rings 26. However, excessively wide edge rings impact the design and use of the oven. Exemplary outer diameters are greater than the wafer diameter by 20 to 40 mm, for example 28 mm. The thickness of the edge ring 26 should be great enough to provide sufficient rigidity to the ring-like structure but thin enough that it not have greatly different thermal capacity than the wafer. Generally, it is preferred that its thickness range from approximately the wafer thickness to about twice the wafer thickness. Present designs utilize thicknesses of 1 to 1.5 mm.

The edge ring 26 is preferably machined from pure silicon, for example, of randomly oriented polycrystalline silicon (ROPSi), for example, Czochralski-grown silicon pulled from the melt using a randomly oriented silicon seed, for example, a seed of virgin silicon or a seed of polycrystalline silicon traceable to a CVD grown seed. This material and its growth and machining are described in U.S. Provisional Application 60/694,334, filed Jun. 27, 2005 and in U.S. patent application Ser. No. 11/328,438, filed Jan. 9, 2006 and now published as U.S. Patent Application Publication 2006/0211218, incorporated herein by reference. The fabrication process advantageously includes Blanchard grinding of the surfaces after wire or saw cutting from a silicon ingot in order to generate surface damage on the exposed surfaces to increase the bonding of films deposited thereupon. Ceramic machining techniques are used to fabricate the ring shape from wafer-shaped blanks. In order to remove impurities, especially heavy metals, the rings may be cleaned after machining by techniques used to clean silicon wafers, for example, using a combination of acid or alkaline etchants. After fabrication of the edge ring 26 has been completed, it is advantageous to pre-coat it in a CVD process on all surfaces with a layer of the same material CVD deposited in the oven or deposition process with which it will be used, that is, silicon nitride for a silicon nitride furnace and silicon dioxide for a silicon dioxide furnace. The pre-coat layer will be firmly anchored in the cracks and crevices created as part of the surface damage and will bond well to after-deposited layers of the same material.

Other types of silicon may be used for the edge rings, for example, monocrystalline silicon. However, Czochralski-grown (CZ) monocrystalline silicon is generally not available in larger diameters at this time needed for 300 mm towers and is further subject to chipping and fracture. Cast silicon is available, which is typically randomly oriented and of adequate size, but its purity and often its strength are generally less than that of randomly oriented CZ polysilicon. It is understood that a silicon material usable according to some aspects of the invention is composed of at least 99 at % elemental silicon although most of the types of silicon mentioned above are much purer.

It must be emphasized however that many aspects of the inventive edge ring are not limited to silicon rings and towers and may be applied to rings or towers composed of other materials such as quartz, silicon carbide, or silicon-impregnated silicon carbide. Silicon-impregnated silicon carbide can be achieved by either exposing nearly stoichiometric silicon carbide to a silicon melt or by blending controlled amounts of silicon and graphite powder, casting the mixture, and firing the cast to obtain a selected ratio of silicon to carbon.

Figure 4:
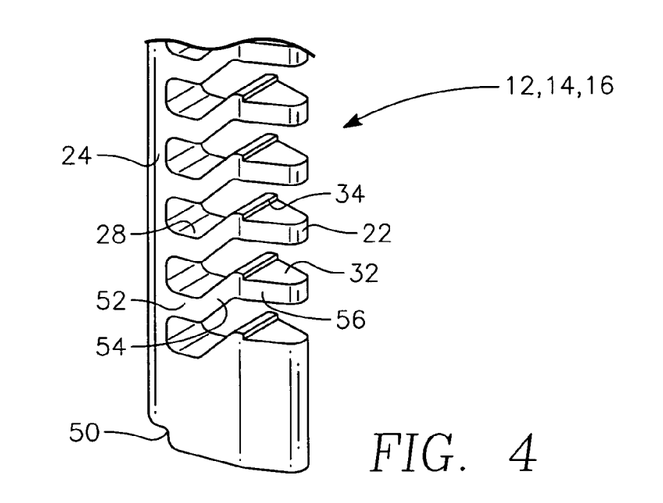
FIG. 4 is an exploded orthographic view of one of the legs of the tower of FIGS. 1 and 2.

Referring specifically to FIG. 4, the leg 12, 14, 16 includes a tendon 50 at both its lower end and unillustrated upper end to fit within a corresponding mortise hole in the bottom base 18 or unillustrated top base. The fingers 22 extend radially inwardly in a generally horizontal direction from the leg stem 24 in generally constant thickness and constant width sections 52, on top of which is formed the ring support surfaces 28. The fingers 22 then extend farther radially inwardly in a partially upward direction in sloping sections 54, which may have a constant width but not necessarily so. The fingers 22 then extend farther radially inwardly in a generally horizontal direction but with converging sidewalls 56 in wedge shaped tips, on top of which are formed the wafer support surface 32 bounded on their radially outer sides by the ridges 34. Sidewalls 58 of the recesses 42, 44, 46 in the ring 26 of FIG. 5, are sloped similarly to the tip sidewalls 56 but are separated by a somewhat greater distance than the separation of the tip sidewalls 56 to allow the edge ring 26 to vertically pass by the tip sidewalls 56.

As a result, the edge ring 26 can be manually or robotically inserted into the tower 10 for a set of three corresponding fingers 22 at a level above the top of the ridges 34 for all three legs 12, 14, 16. When the edge ring 26 has reached almost the stem 24 of the back leg 16, the edge ring 26 is lowered, with the recess sidewalls 58 passing the tip sidewall 56, such that the ring support segments 48 are laid to rest on the ring support surfaces 28 of the legs 12, 14, 16. The sloping sections 54 of the fingers 22 help in centering and aligning the edge rings 26 to the 12, 14, 16. Once the edge ring 26 has been placed on the edge support surfaces 28, it remains there under the force of gravity. However, if desired, the edge ring 26 can be removed in an inverse procedure.

Figure 6:
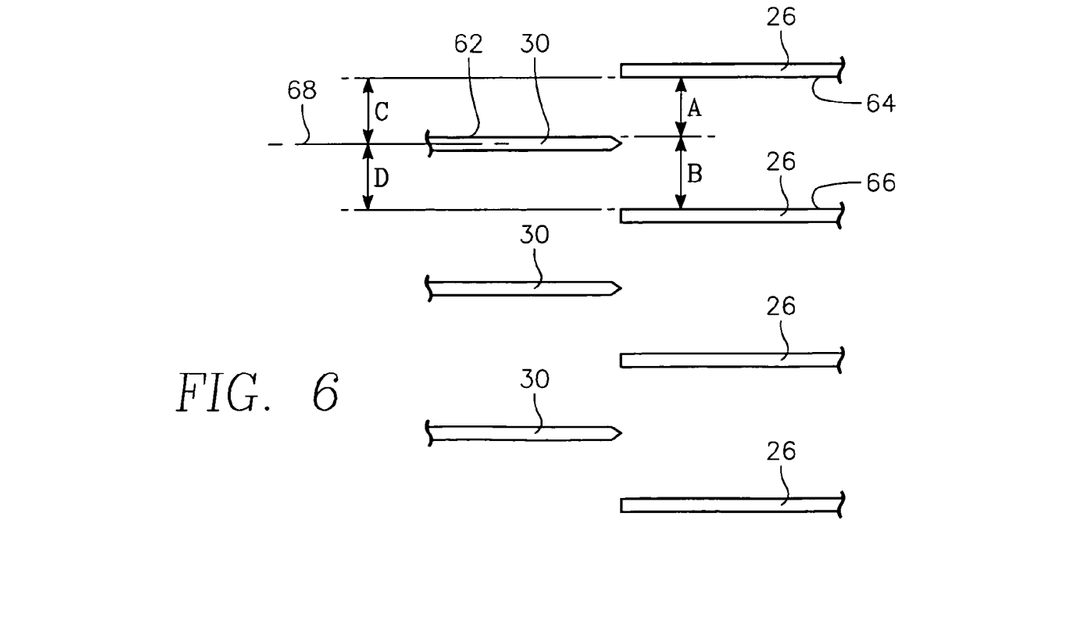
FIG. 6 is a elevational view of the wafers and edge rings in areas away from the legs.

It is desired that vertical spacing between the wafers 30 and the edge rings 26 be closely controlled. As illustrated in the elevational view of FIG. 6 taken along a radius not passing through a leg, a top surface 62 of any wafer 30 is separated by a distance A from a bottom surface 64 of the edge ring 26 immediately above and by a distance B from a top surface 66 of the edge ring 26 immediately below. On the other hand, a median plane 68 of the wafer 30 is separated from the bottom surface 64 of the upper edge ring 26 by a distance C and from the top surface 66 of the lower edge ring 26 by a distance D. A first design principle sets the spacings according to A=B. A second design principle sets the spacings according to C=D. Probably the former favors uniformity for transient conditions while the latter favors uniformity for equilibrium. Either design principle determines the vertical separation between the wafer support surface 32 and the edge support surface 28 of each finger 22 taking into account the vertical pitch of the fingers 22 and the thicknesses of the edge rings 26 and the wafers 30. With either arrangement and with equal thicknesses for wafers and edge rings, the thermal loading averaged between the wafers and edge rings remains substantially constant to well outside the periphery of the wafers. This figure also illustrates that any wafer 30 views equal areas of either other wafers 30 or the edge rings 26, both sets of which are at substantially the same temperature, thereby reducing the edge effects on the wafers 30. It is also desirable that the bottom of the wedge-shaped finger tip is approximately at a level of the bottom surface of the edge ring 26 supported on the ring support surface 28, thereby maximizing clearance for wafer transfer after the edge rings 26 have been placed in the tower 10. It is understood that other design principles including axially varying spacings are possible.

After the edge rings 26 have been loaded into the tower 10, wafers 30 can be inserted into and removed from the tower 10 without interference from the edge rings 26 already located there. The edge rings 26 may remain on the tower 10 during multiple wafer cycles.

If an edge ring 26 breaks for whatever reason, it can be removed from the tower 10 and replaced by a new one without needing to build a new tower 10.

Another embodiment provides separate leg fingers for the wafer and the edge ring. As illustrated in the orthographic view of FIG. 7, an edge ring 70 includes two side recesses 72, 74 and a back recess 76. All the recesses 72, 74, 76 may be rectangularly cut into the outer periphery of the ring 70 to conform to similarly shaped structure in the legs at angular positions corresponding to the recesses 42, 44, 46 of FIG. 5. A leg 80 illustrated completely in the orthographic view of FIG. 8 and partially in the exploded orthographic view of FIG. 9 may be used for any of the legs of the tower of FIGS. 2 and 3 to support and interlock the ring 70. The leg 80 includes wafer fingers 82 and ring fingers 84 interleaved with each other and generally extending horizontally radially inwardly from an axially extending stem portion 86.

Figure 8:
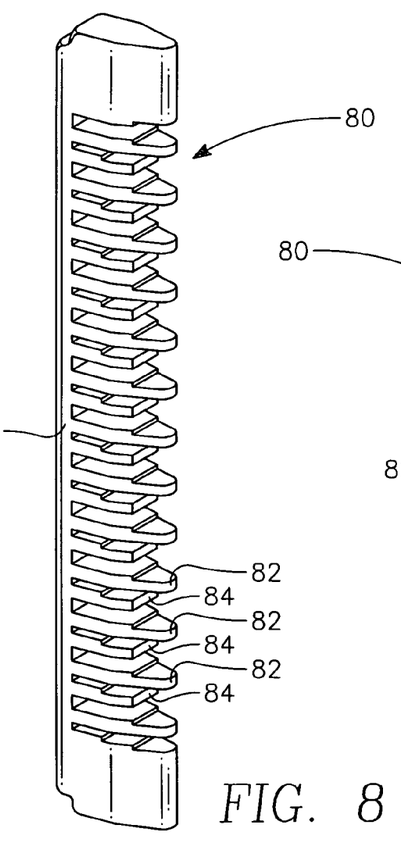
FIG. 8 is an orthographic view of a tower leg with which the edge ring of FIG. 7 may be used.
Figure 9:
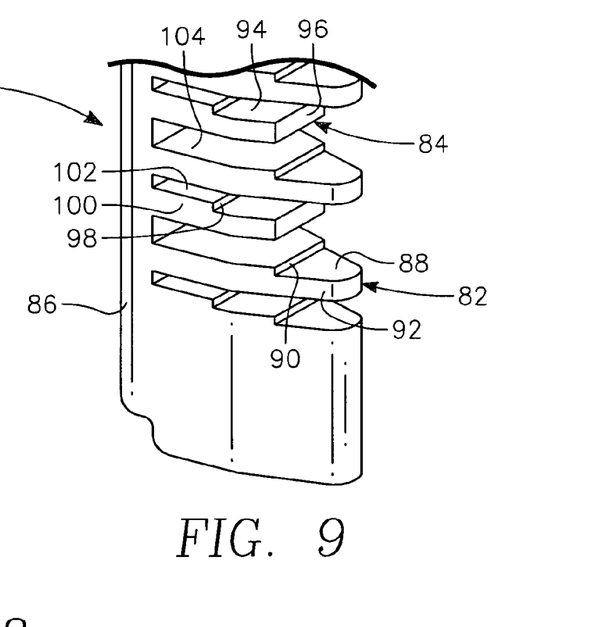
FIG. 9 is an exploded view of FIG. 8.

The wafer fingers 82 each include a wafer support area 88, which may be horizontal or, if desired sloping with a flat support tip area. The back or radially outer side of the wafer support area 88 is defined by a wafer ridge 90, which aligns the wafers on the wafer support areas 82. Tapered sidewalls 92 on the outer portion of the wafer finger 82 produce a wedge shaped tip. The ring fingers 84 each include a typically flat and horizontally extending ring support area 94 defined on its front by a finger edge 96 and on its back by a ring ridge 98 positioned slightly in back of the intended periphery of the edge ring 80. The relative radial and axial positions of the wafer and ring support areas 88, 94 may be designed according to the same constraints discussed for the first embodiment.

Conveniently, the finger edge 96 may be vertically machined at the same radial location as the wafer ridge 90, which also provides more clearance for the transfer of wafers. A finger step 100 formed in the back of the ring ridge 98 has a width slightly less than the width and a similarly generally rectangular or other shape of the ring recesses 72, 74, 76. A passageway 102 between the top of the finger step 100 and the bottom of the wafer finger 82 above is thicker than the thickness of the edge ring 70 to allow the edge ring 70 to pass through it. Thereby, the edge ring 70 can be inserted into the assembled tower by passing or sliding it along the passageway 102 above its intended finger ridge 96 of at least the side legs. When the edge ring reaches its intended position, the ring recesses 72, 74, 76 are positioned around the respective finger step 100 and the edge ring 70 can fall or be lowered with its recesses passing the sides of the finger step 100 until the edge ring 70 rests on the edge support area 94 and is gravitationally interlocked to the finger step 100. Once the edge rings 70 have been all loaded, they may be left there as sequential sets of wafers are loaded and unloaded from the tower. However, the edge rings 70 are detachable from the legs for maintenance, replacement, or other reasons.

A recess 104 in back of the wafer support area 88 is typically required for at least the front legs, which are positioned in front of the center of the supported wafer, to allow the total diameter of the wafer to be inserted past the front legs and then lowered onto the wafer support surface. However, the depth of the recess 104 may be reduced, as shown for the leg 106 illustrated in the orthographic view of FIG. 10. As a result, the fingers 82, 84 are less distinctly separated.

Figure 10:
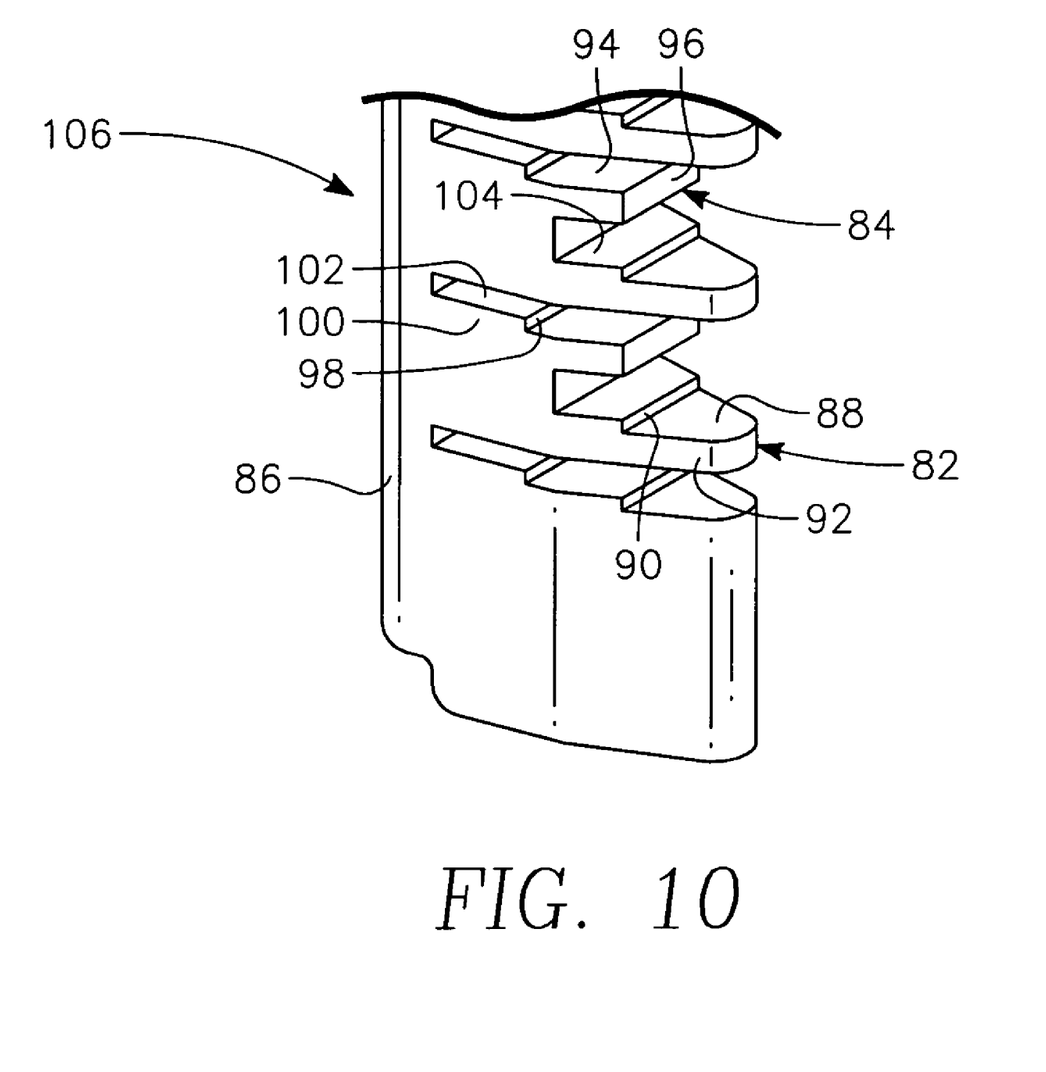
FIG. 10 is an exploded view of a modification of the tower leg of FIG. 8.

In a variant of the leg 106 of FIG. 10, the separate wafer and ring fingers 82, 84 are combined into a single finger by extending the step 90 in back of the wafer support area 88 upwardly to the level of the edge ring support area 94 to merge with the finger ridge 96 and to eliminate the recess 104 in back of the wafer support area 88. The resultant structure is the inverse of the structure of FIG. 4 for which the fingers 22 extend downwardly and on each finger the wafer support are 32 is below the ring support area 28. This leg 106 has the advantage of less machining and more mechanical strength but introduces additional leg mass near the edge of the wafer. It is possible for the back leg behind the wafer center to be formed with a two-tier finger with the lower and radially inner tier supporting the wafer and the upper and radially outer tier supporting the edge ring.

Figure 7:
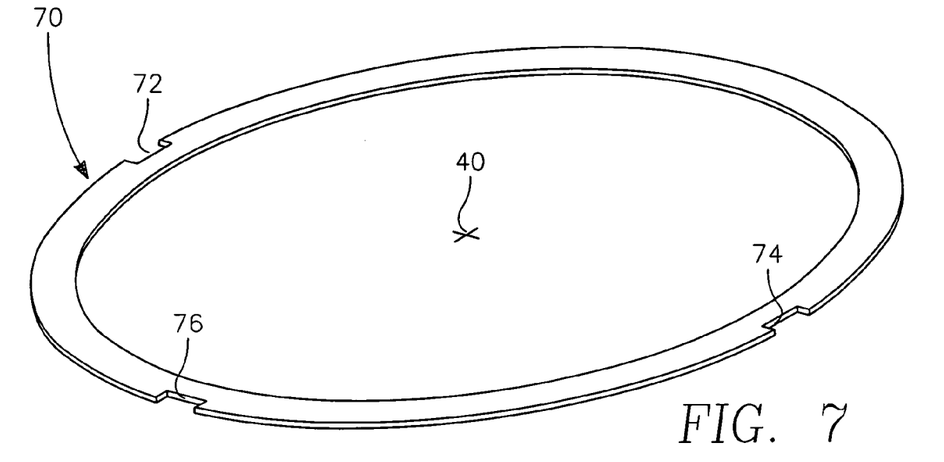
FIG. 7 is an orthographic view of another embodiment of the edge ring.

Because the side recesses 72, 74 lock the edge ring 70 of FIG. 7 to the two front legs, there is no need for a locking mechanism on the back leg. That is, it is possible to eliminate the back recess 76 in the edge ring 70 and to extend backwardly the edge step 98 of the back leg 80, 106, possibly to the leg stem 86, to align the circular periphery of the edge ring 70. The reduced machining is offset by the need to separately design and inventory two types of legs.

Figure 11:
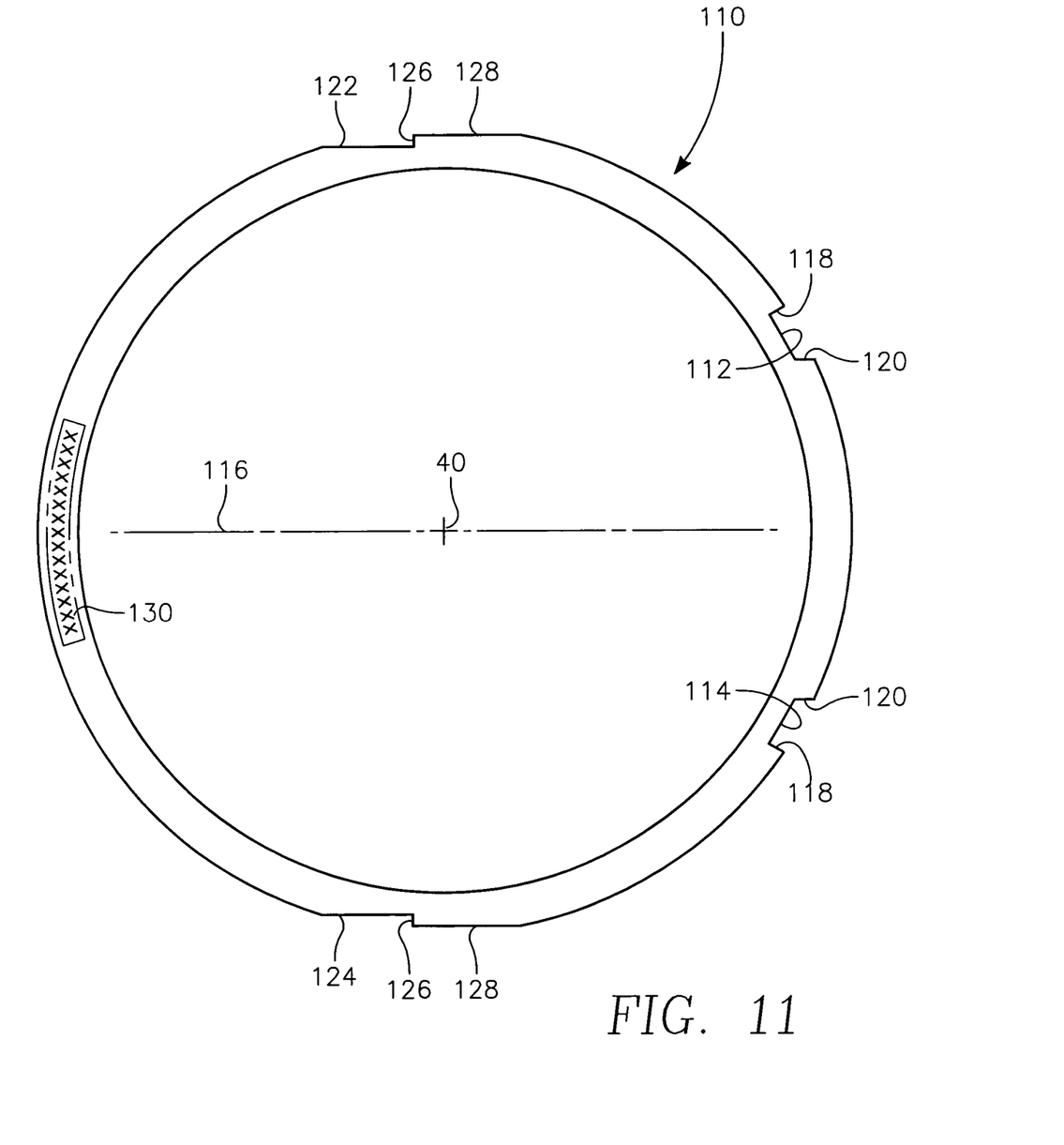
FIG. 11 is plan view a yet another embodiment of the edge ring configured for a four-leg tower.

Another edge ring 110, illustrated in the plan view of FIG. 11, is configured for a tower having four legs 80. Two back recesses or notches 112, 114 engage two back legs 80, which are offset at equal and opposite angles from an insertion axis 116 and face the center 40. Outer sides 118 of the notches 112, 114 are cut close to the radius to the center 40 while inner sides 120 are cut parallel to the insertion axis 116 to facilitate loading onto the legs 80. Inner flats 122, 124 are cut parallel to the insertion axis 116 but extend only partially toward the back to form ring steps 126. Preferably the ring steps 126 are disposed forward of the perpendicular diameter passing through the center 40. Two side legs 80 are disposed at least partially and preferably completely forward of the center 40 and oriented to face perpendicularly toward the insertion axis 116.

Figure 12:
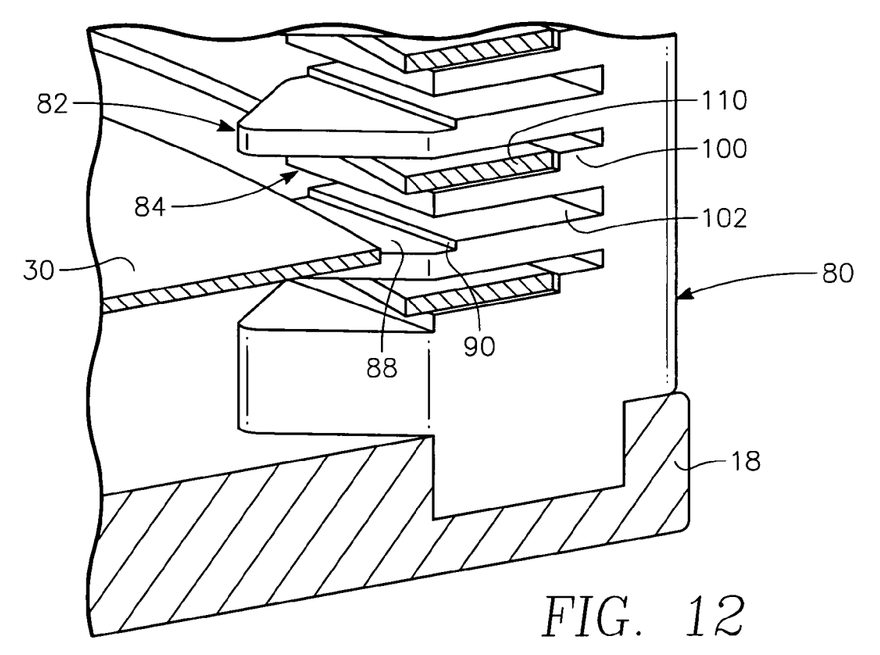
FIGS. 12 and 13 are orthographic views taken from the front and back side respectively of the engagement between the edge ring of FIG. 11 and a side leg of the tower of FIG. 12.
Figure 13:
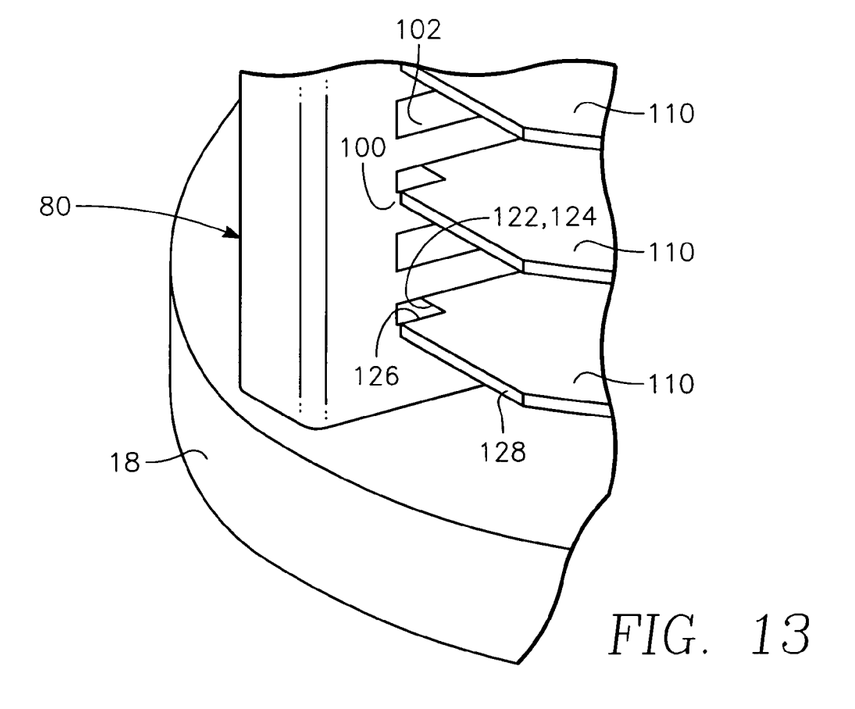

When the edge ring 110 is loaded, as illustrated orthographically in the front view of FIG. 12, the inner flats 122, 124 are aligned to the wafer ridges 90 of the respective side legs 80 and, as illustrated orthographically in the back view of FIG. 13, the ring step 126 falls down and is passively and gravitationally locked to the side of the finger step 100 in opposition to the engagement of the edge ring 110 to the back legs 80. In this position, the edge ring 110 is stably supported by the back legs far in back of the center 40 and by the front legs 80 slightly but completely in front of the center 40. As illustrated in FIG. 11, outer flats 128 may be cut into the lateral sides of the edge ring 110 parallel to the insertion axis 116 to facilitate loading of the edge ring 110 past the side legs 80 and reduce the lateral width of the tower and its legs. A part number and/or serial number 130 may be engraved on a planar surface of the edge ring 110.

The configuration of the side flats 122, 124 and ring steps 126 can be substituted for the side notches 72, 74 in the three-leg ring 70 of FIG. 7.

As has been discussed previously for edge ring 70, the back recesses 112, 114 of the edge ring 110 can be eliminated if the back leg is separately configured to contact the circular periphery of the edge ring 110.

Figure 14:
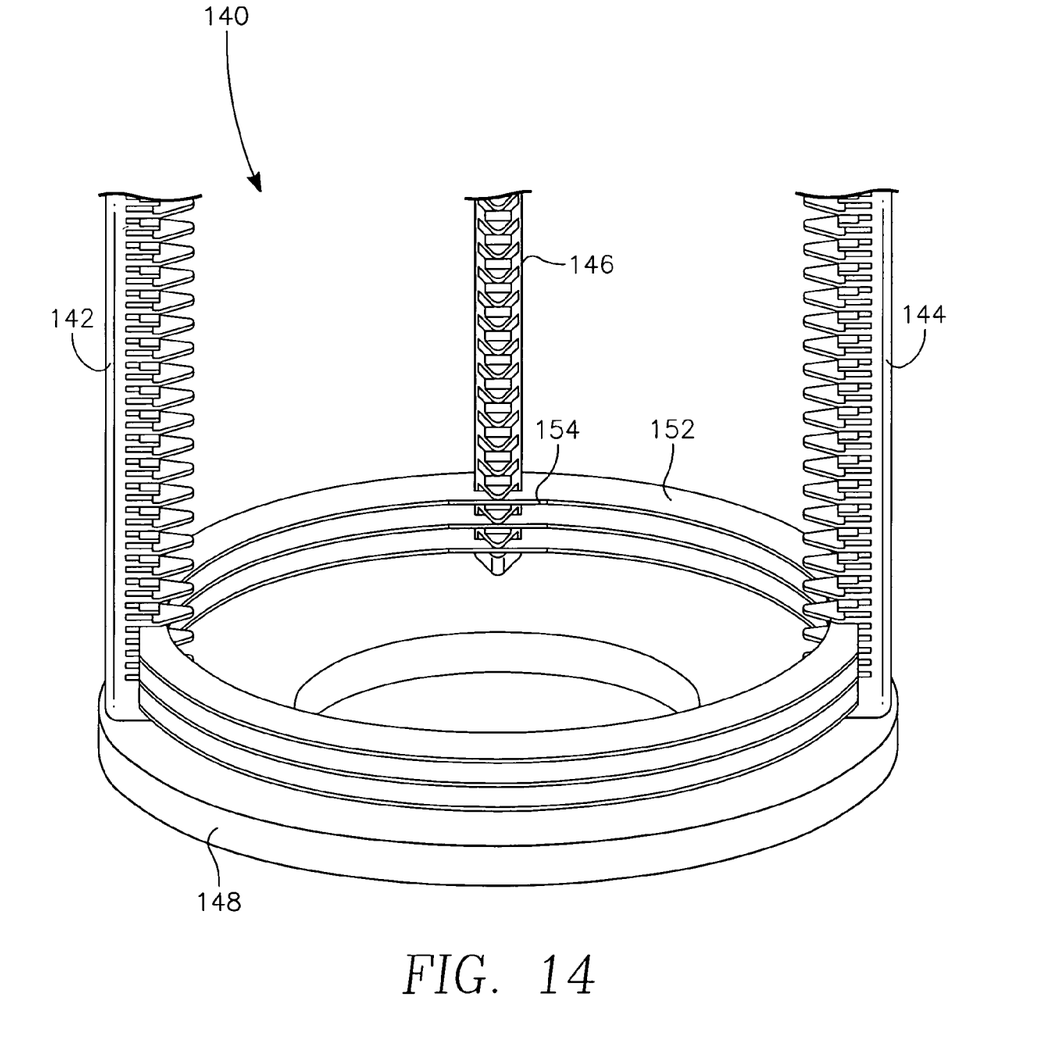
FIG. 14 is an orthographic view of a three-leg tower partially loaded with an edge ring which is variant of the edge ring of FIG. 11.
Figure 15:
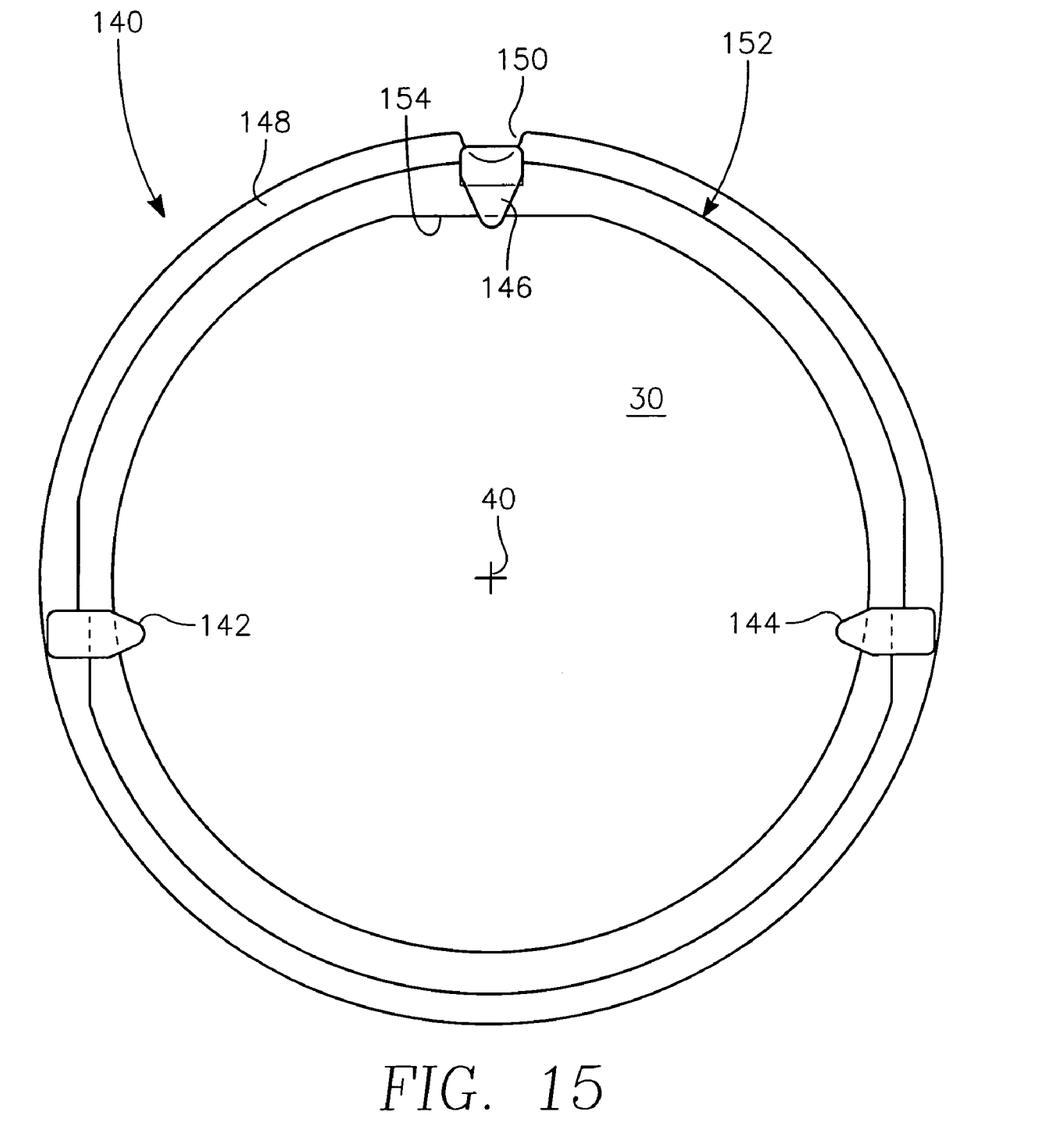
FIG. 15 is partially sectioned plan view of the tower and edge ring of FIG. 14 and additionally illustrating a wafer.

The edge ring 110 of FIG. 11 is designed for a tower having four legs. On the other hand, a tower 140 illustrated in the partial orthographic view of FIG. 14 and the partially sectioned plan view of FIG. 15 has only three legs, specifically, two side legs 142, 144 and one back leg 146 fixed on their lower ends to a bottom base 148 and at their top ends to an unillustrated top base. As illustrated, the side legs 142, 144 are located completely forward of the center 40 of the tower 140, wafer 30, and edge rings 152. Notches 150 are formed in both the back of the back leg 146 and the back of the base 148 to accommodate a thermocouple to measure the temperature close to the wafers. Fingers are formed in the legs 142, 144, 146 for supporting edge rings 152 and wafers 30 (not illustrated in FIG. 13). The fingers differ between the side legs 142, 144 and the back legs 146 to allow the side legs 142, 144 to pass the side step of the edge ring 152. The inner periphery of the edge ring 152 is mostly circular about the center 40 and spaced slightly outwardly of the outer periphery of the wafer 30 except for an inner flat 154 which slightly overhangs the wafer 30. The outer periphery of the edge ring 152 is mostly circular about the center but includes two side steps and a back notch to passively interlock the edge ring 152 to the legs 142, 144, 146.

It is anticipated that after extended operation of a deposition process, the film thickness will build up to a sufficient thickness on both the tower 10 and the edge rings 26, 70, 110, 152 that particle flaking may become a problem. It is also probable by this time that deposited film has glued the edge rings to the tower 10 by bridging between them. There are standard procedures for cleaning films from silicon. Accordingly, both the silicon tower 10 and the attached silicon edge rings can be placed in an etching bath that removes the deposited layer without removing the underlying silicon. For example, HF removes both silicon oxide and silicon nitride from silicon. Silicon parts afford greater selectivity in the cleaning than do quartz parts. It is possible in the case of a broken edge ring that a similar tower and ring etch be performed to remove a broken edge ring having fragments glued to the tower before the fragments are removed.

It is understood that the shape of the edge ring is not limited to those described above.

Although a silicon edge ring offers great advantages, other features of the invention including the detachable configuration are also useful even if the tower or the edge rings are composed of other materials, such as quartz, silicon carbide, or silicon impregnated silicon carbide. For all these materials, the simple structure of the rings and towers and the ease of refurbishment can provide significant manufacturing economies.

The invention is not limited to the described HTO process but may be used for other processes, other process gases if any, other wafers such as silicon-on-insulator wafers or glass or ceramic substrates, and other processing temperatures. Although the invention is most useful for high-temperature processes, it may be applied to lower-temperature processes such as chemical vapor deposition.

When the edge ring is made of silicon, an all-silicon hot zone is enabled for a furnace useful for large-scale commercial production. A vertically arranged furnace 160 illustrated in the cross-sectional view of FIG. 16 includes a thermally insulating heater canister 162 supporting a resistive heating coil 164 powered by an unillustrated electrical power supply. A bell jar 166, typically composed of quartz, includes a roof and fits within the heating coil 164. A liner 168, for example, open ended, fits within the bell jar 166. A support tower 170, corresponding to the previously described towers, has three or four legs 172 fixed to top and bottom bases 174, 176 or supporting both wafers and edge rings not illustrated here. The support tower 170 sits on a pedestal 178. During processing, the pedestal 178 and support tower 170 are generally surrounded by the liner 168. One or more gas injector 180 having outlet ports at different heights are principally disposed between the liner 168 and the tower 170 and have outlets for injecting processing gas at different heights within the liner 168. An unillustrated vacuum pump removes the processing gas through the bottom of the bell jar 166. The heater canister 162, bell jar 156, and liner 168 may be raised vertically to allow wafers to be transferred to and from the tower 170, although in some configurations these elements remain stationary while an elevator raises and lowers the pedestal 178 and loaded tower 170 into and out of the bottom of the furnace 160.

Figure 16:
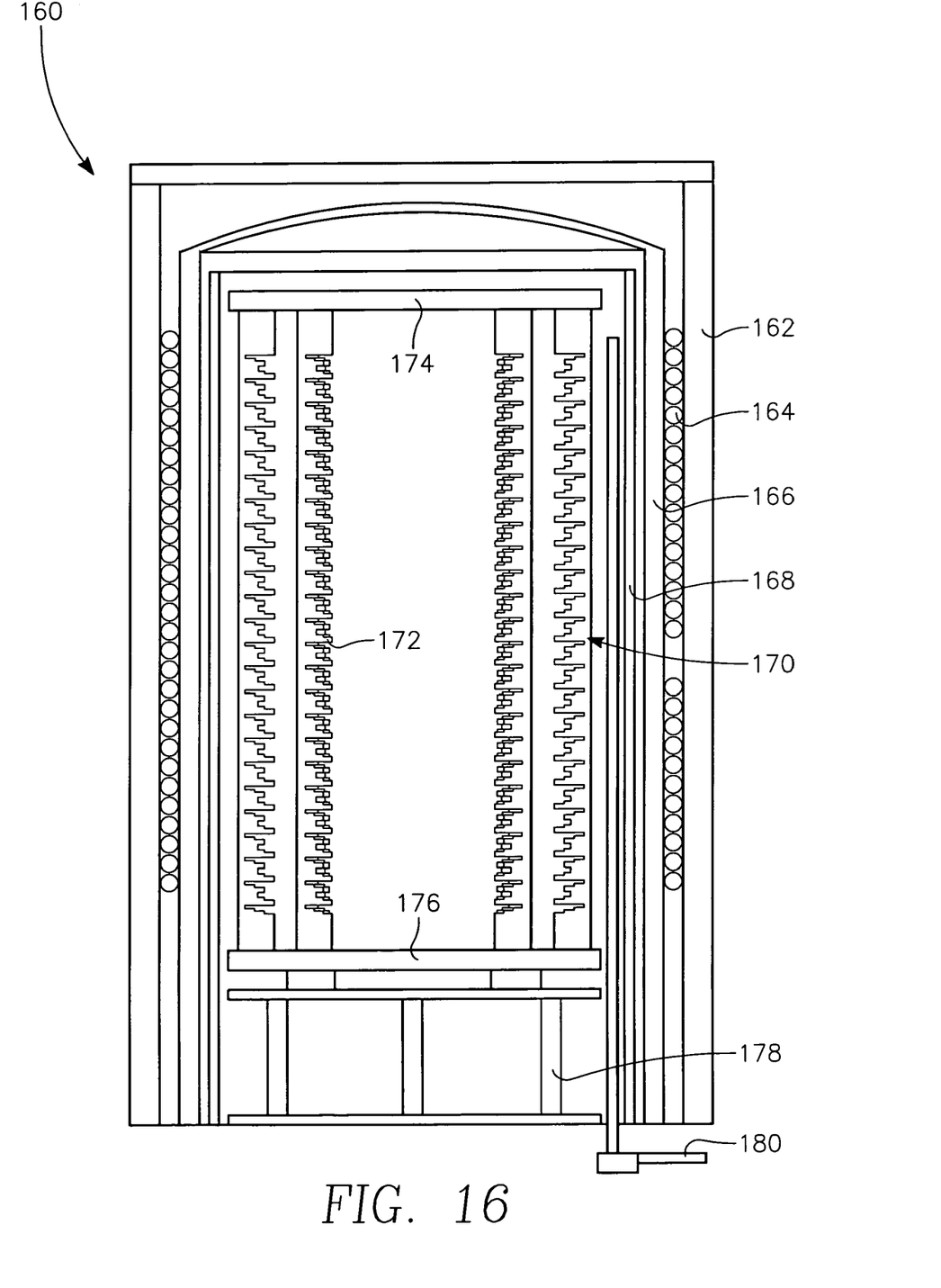
FIG. 16 is a cross-sectional side view of a furnace including a liner, injector, and tower.

The bell jar 168, which is closed on its upper end, tends to cause the furnace 160 to have a generally uniformly hot temperature in the middle and upper portions of the furnace. This is referred to as the hot zone in which the temperature is controlled for the optimized thermal process. However, the open bottom end of the bell jar 168 and the mechanical support of the pedestal 178 causes the lower end of the furnace to have a lower temperature, often low enough that the thermal process such as chemical vapor deposition is not effective. The hot zone may exclude some of the lower slots of the tower 170.

It is advantageous that not only the edge rings but also the tower, liner, and injectors be composed of silicon so that all materials in the hot zone are of the same silicon material as the silicon wafers being processed and be of nearly equal purity. Silicon baffle wafers are also preferably used, as described in the aforecited provisional application 60/694,334 and its utility application Ser. No. 11/328,438. An all-silicon hot zone provides very low particulate and impurity levels in the processing of silicon wafers. Boyle et al. have described the fabrication of silicon towers in U.S. Pat. No. 6,450,346 and of silicon liners in U.S. patent application Ser. No. 10/642,013, filed Aug. 15, 2003 and now published as U.S. Patent Application Publication 2004/0129203 A1, both incorporated herein by reference. Zehavi et al. have described the fabrication of silicon injectors in U.S. patent application Ser. No. 11/177,808, filed Jul. 8, 2005, incorporated herein by reference. Boyle et al. have described a useful adhesive of silicon powder and spin-on glass for assembling silicon structures in US Patent Application Publication 2004/0213955 A1. All these silicon parts are commercially available from Integrated Materials, Inc, of Sunnyvale, Calif.

The invention thus provides greatly improved thermal performance and greatly reduced contamination and particles with a structure that is economical to fabricate and easy to maintain.

The invention claimed is:

1. A tower and edge ring assembly, comprising:
    a tower for supporting a plurality of wafers in a vertical spaced parallel relationship on wafer support areas of the tower disposed at first radial distances from a center of the tower; and
    edge rings detachably supported on and included in the tower and interleaved with and spaced from the wafers, each of the edge rings being annularly shaped about a central ring axis, having a central aperture over at least most of the areas of the wafers and extending radially outwardly from a periphery of the wafers, and including at least one interlocking edge extending at least partially along a radius from the central ring axis to detachably engage the tower and thereby interlock the each edge ring to the tower;
    wherein the tower comprises
        two bases, and
        a plurality of legs extending vertically along a central tower axis and fixed to the two bases, wherein each of the legs includes fingers which extend horizontally from vertically extending portions of the legs and wherein each of the fingers includes a wafer support surface for supporting a first wafer and a lower and ring support surface disposed radially outwardly from the central ring axis for supporting the each edge ring below the first wafer; and
    wherein the each edge ring includes a plurality of radially inner recesses adjacent the central aperture, forming the at least one interlocking edge to engage sides of the fingers, and including segment portions of the each ring which are disposed radially outwardly of the recesses and are supportable on the edge ring support surfaces.

2. The assembly of claim 1, wherein the edge rings have an inner diameter within a range that is larger than and smaller than the diameters of the wafers by no more than 10 mm.

3. The assembly of claim 1, wherein the edge rings and the tower are randomly oriented polycrystalline silicon edge rings and a silicon tower.

4. A tower and edge ring assembly, comprising:
    a tower for supporting a plurality of wafers in a vertical spaced parallel relationship on wafer support areas of the tower disposed at first radial distances from a center of the tower; and
    edge rings detachably supported on and included in the tower and interleaved with and spaced from the wafers, each of the edge rings being annularly shaped about a central ring axis, having a central aperture over at least most of the areas of the wafers and extending radially outwardly from a periphery of the wafers, and including at least one interlocking edge extending at least partially along a radius from the central ring axis to detachably engage the tower and thereby interlock the each edge ring to the tower;
    wherein the tower comprises
        two bases, and
        a plurality of legs extending vertically along a central tower axis and fixed to the two bases, wherein each of the legs includes fingers which extend horizontally from vertically extending portions of the legs and wherein each of the fingers includes a wafer support surface for supporting a first wafer and a lower and ring support surface disposed radially outwardly from the central ring axis for supporting the each edge ring below the first wafer;
    wherein each of the fingers includes a wafer support surface for supporting a first wafer and a higher and radially outward edge ring support surface for supporting one of the edge rings above the first wafer;
    wherein each edge ring includes
        a plurality of radially outer one- or two-sided recesses forming the at least one interlocking edge to engage the fingers, and
        segment portions disposed radially inwardly of the recesses which are supportable on the edge ring support surfaces; and
    wherein each edge ring includes two one-sided recesses each comprising two side flats and a step therebetween.

5. The assembly of claim 4, wherein the fingers of two legs are formed with passage ways above the edge ring support surface which can horizontally pass a wider one of the side flats but the edge ring support areas cannot horizontally pass the wider one of the side flats.

6. The assembly of claim 5, whereby, when one of the edge rings is passed in a first direction through the passage ways, the one edge ring can fall down when disposed in the first direction of the passage ways.

7. A tower and edge ring assembly, comprising:
    a plurality of edge rings each formed annularly about an edge ring central axis, having a central aperture, and including two inner side flats disposed on a periphery of the each edge ring and separated by a first spacing, two outer side flats on the periphery and separated by a second spacing large then the first spacing, and two steps between respective pairs of the inner and outer side flats; and
    a tower including
        two bases,
        a plurality of legs extending parallel to a tower central axis and joined to the bases, and
        fingers formed in each of the legs and each including a wafer support surface disposed on a radially inner side the each finger with respect to the tower central axis for supporting a wafer, a edge ring support area disposed radially outwardly and vertically upwardly from the wafer support surface and sized to accommodate and support the inner side flats, and a passage way disposed radially inwardly and vertically upwardly from the edge ring support area for allowing passage therethrough of the outer side flats.

8. The assembly of claim 7, whereby, after one of the edge rings has been inserted into the tower through the passage way from a first side of the finger, the outer side flat gravitationally falls and is interlocked on an opposed second side of the finger while the one edge ring is supported on the edge ring support area.

9. The assembly of claim 7, wherein each of the edge rings comprises randomly oriented polycrystalline silicon.

10. An edge ring for being spaced apart from and between wafers supported in a wafer support tower, comprising:

a member annular about an axis and including
two outer side flats formed on an outer periphery of the member, extending parallel to an insertion axis, and separated by a first spacing;
two inner side flats formed on the outer periphery, extending parallel to the insertion axis, and separated by a second spacing smaller than the first spacing, and separated by a second spacing smaller than the first spacing, and
two steps connecting respective pairs of the inner and outer side flats.

11. The edge ring of claim 10, wherein the member comprises randomly oriented polycrystalline silicon.

* * * * *